(12) United States Patent
Wang et al.

(10) Patent No.: US 10,651,211 B2
(45) Date of Patent: May 12, 2020

(54) THIN FILM TRANSISTOR AND PREPARATION METHOD THEREOF, ARRAY SUBSTRATE AND DISPLAY APPARATUS

(71) Applicant: BOE TECHNOLOGY GROUP CO., LTD., Beijing (CN)

(72) Inventors: Zuqiang Wang, Beijing (CN); Chien Hung Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 49 days.

(21) Appl. No.: 15/309,949

(22) PCT Filed: Apr. 8, 2016

(86) PCT No.: PCT/CN2016/078844
§ 371 (c)(1),
(2) Date: Nov. 9, 2016

(87) PCT Pub. No.: WO2016/202062
PCT Pub. Date: Dec. 22, 2016

(65) Prior Publication Data
US 2017/0250207 A1    Aug. 31, 2017

(30) Foreign Application Priority Data

Jun. 15, 2015   (CN) .......................... 2015 1 0330790

(51) Int. Cl.
*H01L 29/66* (2006.01)
*H01L 27/12* (2006.01)
*H01L 29/786* (2006.01)

(52) U.S. Cl.
CPC ...... *H01L 27/1281* (2013.01); *H01L 27/1218* (2013.01); *H01L 27/1222* (2013.01);
(Continued)

(58) Field of Classification Search
CPC ............. H01L 27/1281; H01L 27/1222; H01L 29/78603; H01L 27/1288; H01L 27/1218;
(Continued)

(56) References Cited

U.S. PATENT DOCUMENTS 7,704,875 B1 * 4/2010 Wu ..................... H01L 21/0337
257/E21.027
2003/0183875 A1   10/2003 Isobe
(Continued)

FOREIGN PATENT DOCUMENTS

CN        101494235 A    7/2009
CN        101681930 A    3/2010
(Continued)

OTHER PUBLICATIONS

First Chinese Office Action dated May 15, 2017.
(Continued)

*Primary Examiner* — M. A. Golub-Miller
(74) *Attorney, Agent, or Firm* — Dilworth & Barrese, LLP.; Michael J. Musella, Esq.

(57) ABSTRACT

A thin film transistor and a preparation method thereof, an array substrate and a display apparatus are provided. The preparation method includes an operation of forming a low temperature poly silicon active layer; a substrate has a first region and a second region; and the step includes: forming a buffer layer on the first region and the second region of the substrate, the buffer layer having a thickness at a portion corresponding to the first region greater than that at a portion corresponding to the second region; or, forming the buffer layer on the first region of the substrate; forming an amorphous silicon layer on the buffer layer; performing laser crystallization processing on the amorphous silicon layer so as to convert the amorphous silicon layer into a poly silicon layer; and removing the poly silicon layer on the second
(Continued)

region, and forming the low temperature poly silicon active layer on the first region.

7 Claims, 11 Drawing Sheets

(52) U.S. Cl.
CPC ........ *H01L 27/1288* (2013.01); *H01L 29/786* (2013.01); *H01L 29/78603* (2013.01); *H01L 29/78675* (2013.01)

(58) Field of Classification Search
CPC ............. H01L 29/786; H01L 29/78675; H01L 29/78651; H01L 29/6675; H01L 27/1214
See application file for complete search history.

(56) References Cited

U.S. PATENT DOCUMENTS

| 2010/0171546 | A1* | 7/2010 | Kwok | ................... | H01L 29/04 |
| | | | | | 327/537 |
| 2016/0020096 | A1* | 1/2016 | Zhang | ............... | H01L 21/02422 |
| | | | | | 257/66 |
| 2017/0236705 | A1* | 8/2017 | Li | ..................... | H01L 21/02488 |
| | | | | | 438/166 |

FOREIGN PATENT DOCUMENTS

| CN | 103681776 A | 3/2014 |
| CN | 104064451 A | 9/2014 |
| CN | 104900532 A | 9/2015 |

OTHER PUBLICATIONS

Search Report and Written Opinion dated Jul. 12, 2016 from State Intellectual Property Office of the P.R. China.
Second Chinese Office Action dated Jan. 4, 2018.

\* cited by examiner

THIN FILM TRANSISTOR AND PREPARATION METHOD THEREOF, ARRAY SUBSTRATE AND DISPLAY APPARATUS

TECHNICAL FIELD

Embodiments of the present disclosure relate to a thin film transistor and a preparation method thereof, an array substrate and a display apparatus.

BACKGROUND

A thin film transistor (TFT) adopts an amorphous silicon (a-Si) material for an active layer, but the carrier mobility of the a-Si material is only 0.5 cm$^2$/V·s, which is difficult to meet the requirement of a large-sized display apparatus in term of driving frequency. The carrier mobility of a poly-silicon (p-Si) material is obviously higher than that of the a-Si material, but a temperature of a p-Si preparation process is generally higher than 600° C., so the p-Si material is unsuitable for common glass adopted by most display apparatuses. Therefore, those skilled in the art develop a manufacturing process of a new generation of TFT for preparing a Low Temperature Poly Silicon (LTPS) active layer.

The temperature of the preparation process of the LTPS is lower than 600° C., the LTPS can be suitable for the common glass, and generally, excimer laser with a certain energy is utilized to carry out laser radiation on a-Si in a mode of performing laser crystallization by adopting Excimer Laser Annealing (ELA) so as to crystallize the a-Si into p-Si.

SUMMARY

Embodiments of the present disclosure provide a Thin Film Transistor (TFT) and a preparation method thereof, an array substrate and a display apparatus.

The embodiments of the present disclosure adopt the following technical solutions.

An embodiment according to the present disclosure provides a preparation method of a thin film transistor, comprising: an operation of forming a low temperature poly silicon active layer on a substrate, wherein the substrate has a first region and a second region; the first region corresponds to a pattern of the low temperature poly silicon active layer to be formed, and the second region is at least positioned on both opposite sides of the low temperature poly silicon active layer to be formed; and the operation of forming the low temperature poly silicon active layer on the substrate includes: forming a buffer layer on the first region and the second region of the substrate, the buffer layer having a thickness at a portion corresponding to the first region greater than that at a portion corresponding to the second region; or, forming a buffer layer on the first region of the substrate; forming an amorphous silicon layer on the buffer layer; performing laser crystallization processing on the amorphous silicon layer so as to convert the amorphous silicon layer into a poly silicon layer; and removing the poly silicon layer on the second region, and forming the low temperature poly silicon active layer on the first region.

In one example, the low temperature poly silicon active layer comprises a predetermined region, a source electrode contact region and a drain electrode contact region; and the predetermined region corresponds to a region opposite to a source electrode and a drain electrode which are to be formed; the source electrode contact region and the drain electrode contact region are respectively positioned on both opposite sides in the first region, which are close to the second region; after the low temperature poly silicon active layer is formed on the first region, ion doping is carried out on the source electrode contact region and a first portion region of the predetermined region, which is close to the source electrode contact region, so as to form a first doped region; and ion doping is carried out on the drain electrode contact region and a second portion region of the predetermined region, which is close to the drain electrode contact region, so as to form a second doped region.

In one example, the operation of forming the low temperature poly silicon active layer on the substrate further includes: forming the buffer layer on the first region and the second region of the substrate by a first patterning process, the buffer layer having the thickness at the portion corresponding to the first region greater than that at the portion corresponding to the second region; or, forming the buffer layer on the first region of the substrate by a first masking process; removing the poly silicon layer on the second region by a second patterning process, and forming the low temperature poly silicon active layer on the first region; shielding a region in the predetermined region except the first portion region and the second portion region by a masking process; carrying out ion doping in the source electrode contact region and the first portion region of the predetermined region, which is close to the source electrode contact region, so as to form the first doped region; and carrying out ion doping in the drain electrode contact region and the second portion region of the predetermined region, which is close to the drain electrode contact region, so as to form the second doped region, wherein the masking process and the first patterning process adopt a same mask; and/or, the masking process and the second patterning process adopt a same mask.

In one example, the operation of removing the poly silicon layer on the second region by the second patterning process and forming the low temperature poly silicon active layer on the first region includes: forming photoresist on the formed poly silicon layer; carrying out exposure and development with the mask on the substrate on which the photoresist is formed so as to form a photoresist fully-reserved region and a photoresist fully-removed region, wherein the photoresist fully-reserved region corresponds to the first region, and the photoresist fully-removed region corresponds to the second region; and removing the poly silicon layer exposed out of the photoresist fully-removed region by an etching process, so as to form a pattern of the low temperature poly silicon active layer.

In one example, the operation of shielding the region in the predetermined region except the first portion region and the second portion region by the masking process includes: carrying out for a first-time exposure and development with the mask on the substrate on which the photoresist fully-reserved region is formed so as to form a first photoresist fully-reserved region and a first photoresist fully-removed region, wherein a fully-transmittance region of the mask corresponds to the first photoresist fully-removed region, and the first photoresist fully-removed region corresponds to the first doped region to be formed or the second doped region to be formed; and a fully-non-transmittance region of the mask corresponds to the formed first photoresist fully-reserved region, and the first photoresist fully-reserved region corresponds to a remaining region of the photoresist fully-reserved region; and carrying out for a second-time exposure and development with the mask on the substrate on which the first photoresist fully-reserved region is formed so as to form a second photoresist fully-reserved region and a second photoresist fully-removed region, wherein the fully-transmittance region of the mask corresponds to the second photoresist fully-removed region, and the second photoresist fully-removed region corresponds to the second doped region to be formed or the first doped region to be formed; and the fully-non-transmittance region of the mask corresponds to the formed second photoresist fully-reserved region, and the second photoresist fully-reserved region corresponds to a remaining region of the first photoresist fully-reserved region.

In one example, the operation of forming the buffer layer on the first region and the second region of the substrate by the first patterning process, the buffer layer having the thickness at the portion corresponding to the first region greater than that at the portion corresponding to the second region, includes: sequentially forming a buffer layer thin film and photoresist on the substrate; carrying out exposure and development with the mask on the substrate on which the photoresist is formed so as to form the photoresist fully-reserved region and the photoresist fully-removed region, wherein the photoresist fully-reserved region corresponds to the first region and the photoresist fully-removed region corresponds to the second region; rendering a thickness of a portion of the buffer layer thin film, which is exposed out of the photoresist fully-removed region, to be smaller than that of a portion of the buffer layer thin film, which is covered by the photoresist fully-reserved region, by a thinning process; and removing the photoresist fully-reserved region covered on the buffer layer thin film corresponding to the second region, by an ashing process.

In one example, the operation of forming the buffer layer on the first region of the substrate by the first patterning process includes: sequentially forming the buffer layer thin film and photoresist on the substrate; carrying out exposure and development with the mask on the substrate on which the photoresist is formed so as to form the photoresist fully-reserved region and the photoresist fully-removed region, wherein the photoresist fully-reserved region corresponds to the first region and the photoresist fully-removed region corresponds to the second region; removing the buffer layer thin film exposed out of the photoresist fully-removed region by the etching process; and removing the photoresist fully-reserved region covered on the buffer layer thin film corresponding to the second region, by the ashing process.

In one example, a width of the first doped region along a turning-on direction is from 1 µm to 2 µm; and/or, a width of the second doped region along the turning-on direction is from 1 µm to 2 µm, wherein the turning-on direction is a direction pointing to the drain electrode contact region from the source electrode contact region.

In one example, before converting the amorphous silicon layer into the poly silicon layer, carrying out a dehydrogenation process on the formed amorphous silicon layer.

In one example, after forming the low temperature poly silicon active layer on the first region, sequentially forming a gate insulating layer, a pattern layer including a gate electrode, an interlayer insulating layer, and a pattern layer including a source electrode and a drain electrode, on the formed low temperature poly silicon active layer, wherein the source electrode and the drain electrode are in contact with the low temperature poly silicon active layer respectively through a first via hole and a second via hole which run through the interlayer insulating layer and the gate insulating layer.

In one example, the buffer layer is made of any one of materials: silicon oxide, silicon nitride or silicon oxynitride.

In one example, the second region is positioned around the first region.

Another embodiment of the present disclosure provides a thin film transistor, comprising: a low temperature poly silicon active layer, wherein grain boundaries in the low temperature poly silicon active layer are at least partially centralized at an edge of the low temperature poly silicon active layer.

In one example, the low temperature poly silicon active layer has a predetermined region, and a source electrode contact region and a drain electrode contact region which are respectively positioned on two opposite sides of the predetermined region; the predetermined region corresponds to a region opposite to a source electrode and a drain electrode which are to be formed; the low temperature poly silicon active layer includes ion doped regions and a non-doped region which are configured to connect grain boundaries; the ion doped regions include a first doped region and a second doped region; the first doped region corresponds to the source electrode contact region and a first portion region of the predetermined region, which is close to the source electrode contact region; and the second doped region corresponds to the drain electrode contact region and a second portion region of the predetermined region, which is close to the drain electrode contact region.

In one example, a width of the first doped region along a turning-on direction is from 1 to 2 µm; and/or, a width of the second doped region along the turning-on direction is from 1 to 2 µm, wherein the turning-on direction is a direction pointing to the drain electrode contact region from the source electrode contact region.

In one example, the thin film transistor further comprises: a gate insulating layer covering the low temperature poly silicon active layer; a pattern layer positioned on the gate insulating layer and including a gate electrode; an interlayer insulating layer covering the pattern layer including the gate electrode; and a pattern layer positioned on the interlayer insulating layer and including the source electrode and the drain electrode, wherein the source electrode and the drain electrode are in contact with the low temperature poly silicon active layer respectively through a first via hole and a second via hole which run through the interlayer insulating layer and the gate insulating layer.

An embodiment of the present disclosure provides an array substrate, comprising: a plurality of thin film transistors arranged in an array, wherein the thin film transistors include any one of the above-disclosed thin film transistors.

An embodiment of the present disclosure provides a display apparatus, comprising the above-described array substrate.

BRIEF DESCRIPTION OF THE DRAWINGS

In order to make those skilled in the art understand the embodiments of the present disclosure more clearly, the embodiments of the present disclosure will be illustrated in more details in connection with the drawings, wherein

FIG. 1b is a top-view structural schematic diagram of an example corresponding to FIG. 1a;

FIG. 1c is a top-view structural schematic diagram of another example corresponding to FIG. 1a;

FIG. 10 is a schematic diagram of a current direction of a TFT device when the TFT device is turned on;

DETAILED DESCRIPTION

Figure 1A:
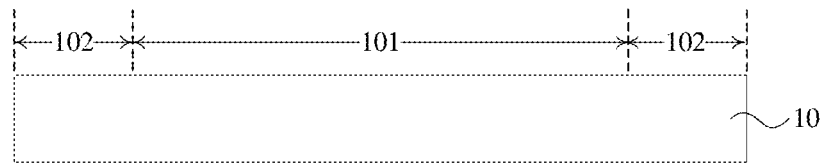
FIG. 1a is a sectional structural schematic diagram of a substrate in a preparation method of a Thin Film Transistor (TFT), which is provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" or the like are only used to indicate relative position relationship, and when the position of the object which is described is changed, the relative position relationship may be changed accordingly.

Inventors have noted that when a piece of amorphous silicon (a-Si) is radiated by laser rays, each region inside the piece of a-Si undergoes the same temperature by radiation, and the probabilities that grains grow towards all directions are basically the same, and thus, after crystallization, the formed poly silicon (p-Si) grains are relatively small. After a TFT is turned on, under the action of an electric field, an on-state is obtained between a source electrode and a drain electrode, i.e., when the TFT is turned on a so-called channel is formed. The size of low temperature poly silicon (LTPS) grains obtained by adopting the preparation method is relatively small, so more grain boundaries corresponding to LTPS in the channel exist; the grain boundaries have high roughness and have a great amount of defects such as dangling bonds and strained bonds; and due to existence of the great amount of grain boundaries and defects, the tunneling and inter-band tunneling phenomena promoted by the defects occur in the TFT which is in the on-state, and thus the leakage current of the TFT is caused to increase and the stability of the electrical performance of the TFT is reduced.

An embodiment of the present disclosure provides a preparation method of a TFT. The preparation method includes the operations described below.

A step of forming an LTPS active layer 01 on a substrate 10 is conducted. As shown in FIG. 1a, the provided substrate 10 has a first region 101 and a second region 102; the first region 101 corresponds to a pattern of the LTPS active layer 01 to be formed, and the second region 102 is at least positioned on both opposite sides of the LTPS active layer 01 to be formed.

Figure 2:
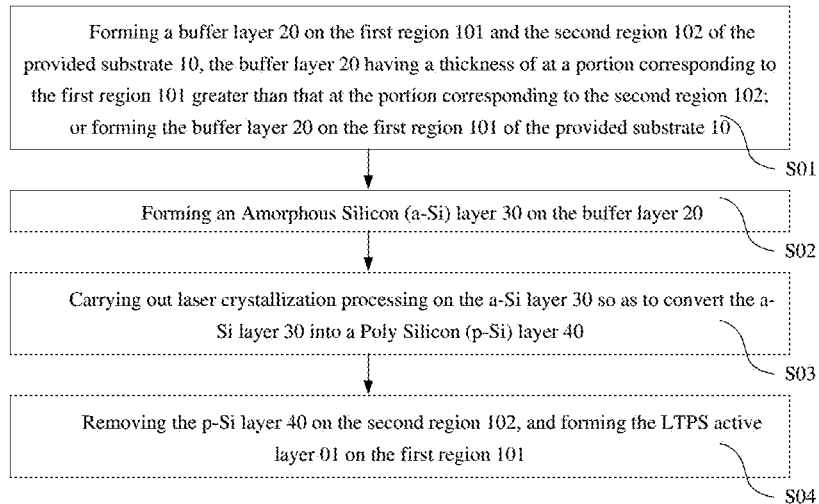
FIG. 2 is a flow schematic diagram of a preparation method of a TFT, which is provided by an embodiment of the present disclosure.
Figure 3A:
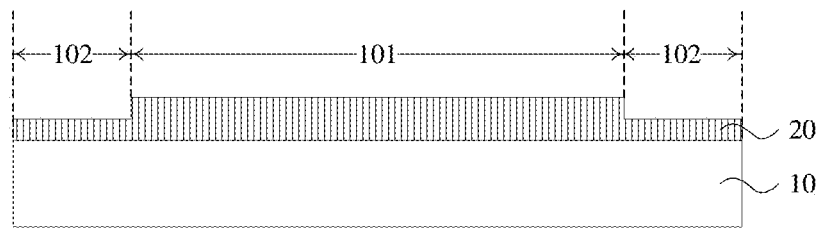
FIG. 3a to FIG. 3b respectively are a first and second sectional structural schematic diagrams obtained in the step S01 in FIG. 2.
Figure 3B:
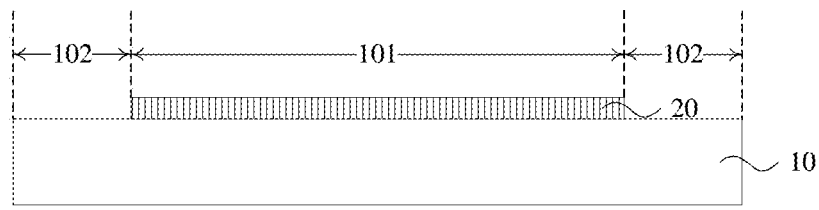

On such basis, as shown in FIG. 2, the step of forming the LTPS active layer 01 on the substrate 10 can include sub-steps as follows:

S01: as shown in FIG. 3a, forming a buffer layer 20 on the first region 101 and the second region 102 of the provided substrate 10, the buffer layer 20 having a thickness of at a portion corresponding to the first region 101 greater than that at the portion corresponding to the second region 102; or, as shown in FIG. 3b, forming the buffer layer 20 on the first region 101 of the provided substrate 10.

Figure 4A:
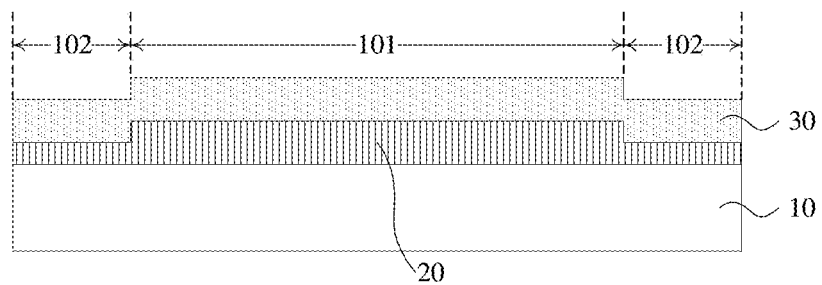
FIG. 4a to FIG. 4b respectively are a first and second sectional structural schematic diagrams obtained in the step S02 in FIG. 2.
Figure 4B:
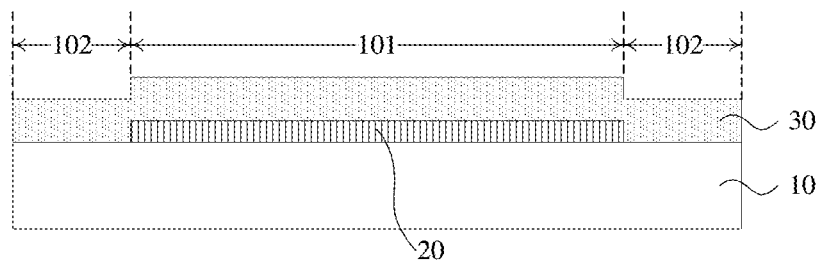

S02: as shown in FIG. 4a or FIG. 4b, forming an amorphous silicon (a-Si) layer 30 on the buffer layer 20.

Figure 5A:
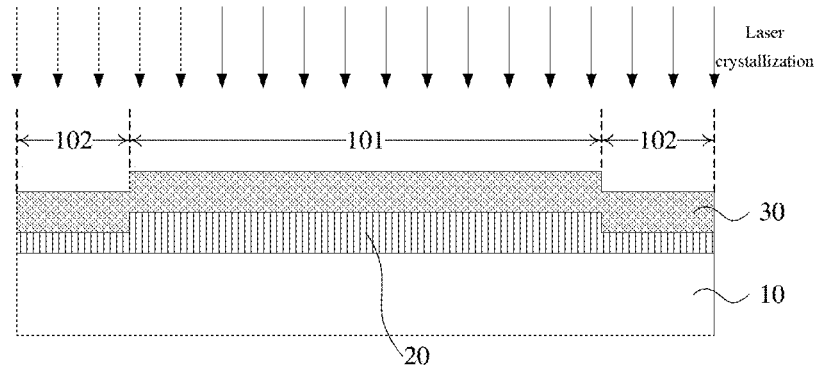
FIG. 5a to FIG. 5b respectively are a first and second sectional structural schematic diagrams obtained in the step S03 in FIG. 2.
Figure 5B:
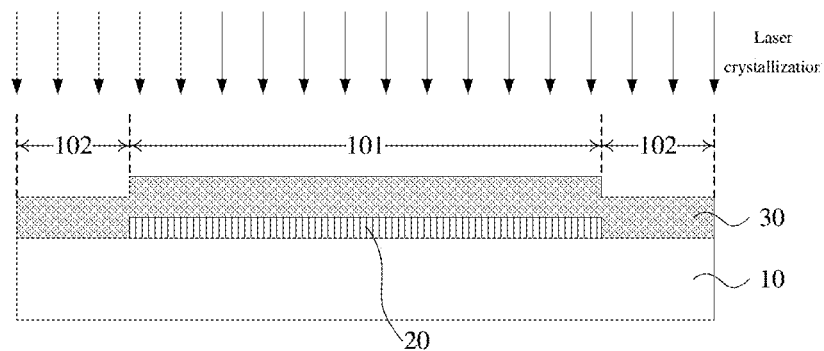

S03: as shown in FIG. 5a or FIG. 5b, performing laser crystallization processing on the a-Si layer 30 so as to convert the a-Si layer 30 into a Poly Silicon (p-Si) layer.

Figure 6A:
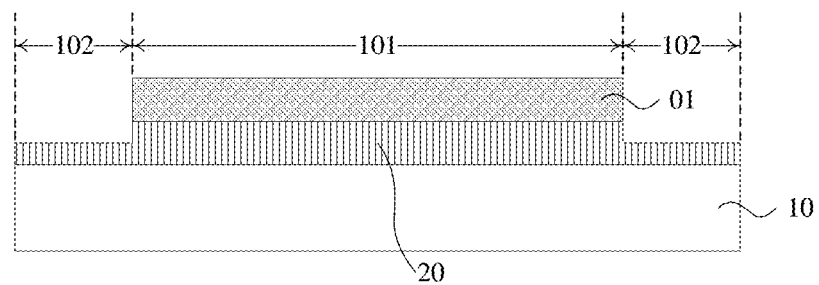
FIG. 6a to FIG. 6b respectively are a first and second sectional structural schematic diagrams obtained in the step S04 in FIG. 2.
Figure 6B:
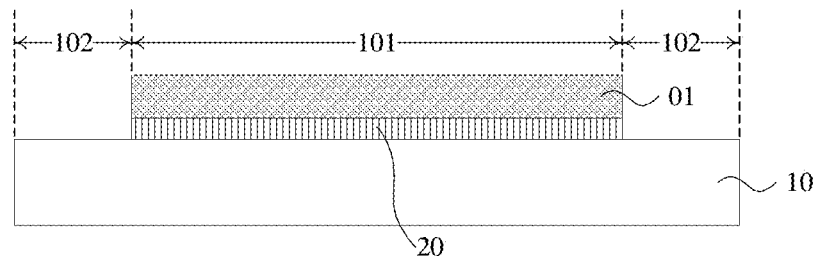

S04: as shown in FIG. 6a or FIG. 6b, removing the p-Si layer 30 on the second region 102, and forming the LTPS active layer 01 on the first region 101.

With the steps S01 to S04, the LTPS active layer 01 is formed.

Figure 1B:
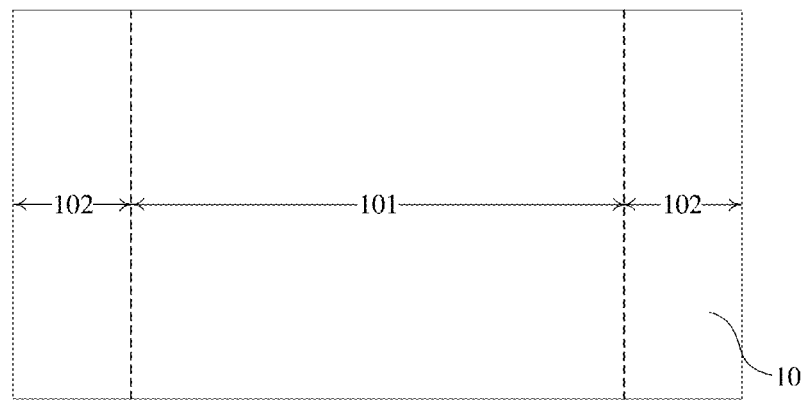
Figure 1C:
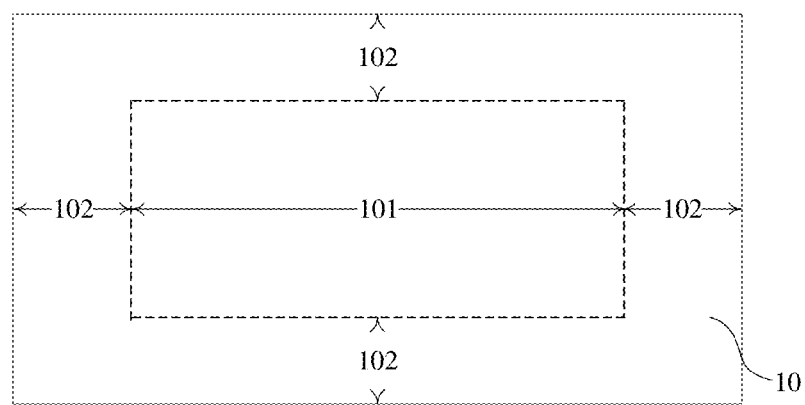

It should be noted that firstly, in the provided substrate 10, as shown in FIG. 1b, the second region 102 can be only positioned on both opposite sides of the LTPS active layer 01 to be formed; or, as shown in FIG. 1c, the second region 102 also can be positioned around the LTPS active layer 01 to be formed, and enclose the first region 101.

Namely, a convex island region compared with a surrounding region is formed below the LTPS active layer 01 to be formed.

Secondly, the steps S01 to S04 are steps for preparing the LTPS active layer 01 in the TFT, and the TFT is an indispensable structure in an array substrate for carrying out display, and thus, the substrate 10 generally is a common glass substrate in a display product.

The glass substrate inevitably can contain some impurity ions, e.g., of aluminum, barium, sodium or the like, and the buffer layer 20 can have an effect of blocking the impurities ions in the substrate 10 from entering the LTPS active layer 01 formed by crystallization in the laser crystallization process, thereby ensuring the excellent performance of the formed active layer.

Therefore, the buffer layer 20 can be made of a material with a uniform and compact structure, e.g., silicon oxide, silicon nitride, silicon oxynitride or the like, and for example, adopts a double structure, the lower layer of which is silicon nitride and the upper layer of which is silicon oxide.

The substrate also can be made of another material, e.g., a quartz substrate, a plastic substrate or the like.

Thirdly, in the step S02, the a-Si layer 30 is formed on the buffer layer 20 by using various methods, e.g., Chemical Vapor Deposition (CVD), Plasma Enhanced CVD (PECVD), Rapid Thermal CVD (RTCVD) or the like, but the embodiments of the present disclosure are not limited hereto and the a-Si layer 30 also can be formed in other ways.

Fourthly, in the step S03, process parameters of laser crystallization processing can adopt process parameters as follows, for example:

The laser pulse frequency is 100 to 500 Hz; the laser pulse width is smaller than 100 ns; the laser scanning speed is 4 to 16 mm/s; the proportion of a laser irradiation overlapping region is 90 to 98%; and the laser energy density is 100 to 500 mJ/cm$^2$.

On such basis, in order to facilitate understanding the preparation method provided by the embodiment of the present disclosure, a crystallization principle of p-Si will be illustrated in the following:

An a-Si thin film adsorbs energy under the laser radiation, so that the surface of the thin film is rapidly warmed up, thereby melting and transforming a-Si into liquid; a molten region will go deep into the a-Si thin film at an ultrahigh speed (e.g., about 10 m/s); and after laser radiation for a certain time period, the a-Si thin film forms a molten layer with a certain depth. After laser radiation is stopped, the molten layer starts to be cooled at a certain speed (about 108 to 1,010 K/s), the interface between a solid phase and a liquid phase will move back to the surface at a relatively low speed (about 1 to 2 m/s), and after cooling, the a-Si thin film is crystallized to form p-Si.

In the process that a-Si is converted into p-Si, the grains start to laterally grow, and the solidifying process is carried out along with movement of the solid-liquid interface. Solid silicon is low in density (about 2.32 g/cm$^3$), so an extra volume after a portion of a-Si is molten will be squeezed to regions which are not solidified. After the solidifying process of the resultant p-Si is completed, two adjacent grains are squeezed together to form a grain boundary, so the grain boundaries are solidified last in the crystallization process of the resultant p-Si; and the residual volumes will be accumulated at the grain boundaries to form protrusions, the protrusions at the grain boundaries cause high surface roughness of the formed p-Si grains, and the surface roughness of the grains is proportional to the leakage current generated when the TFT is in the on-state.

By the preparation method provided by the embodiment of the present disclosure, the thickness of the buffer layer 20 at the portion corresponding to the first region 101 is greater than that at the portion corresponding to the second region 102; or the buffer layer 20 is only formed on the first region 101, and thus, equivalently, the convex island region compared with the surrounding region is formed below the portion of the a-Si layer 30 formed in the step S02, which corresponds to the LTPS active layer 01 to be formed.

Figure 7A:
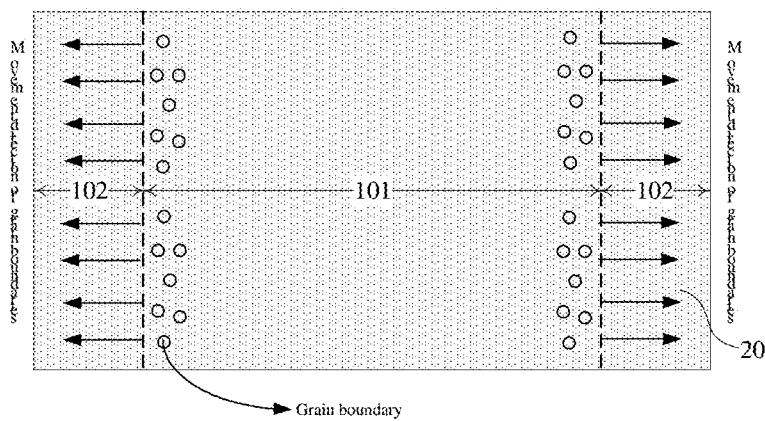
FIG. 7a to FIG. 7b respectively are a first schematic diagram and a second schematic diagram of a crystallization principle of a preparation method of a TFT, which is provided by an embodiment of the present disclosure.
Figure 7B:
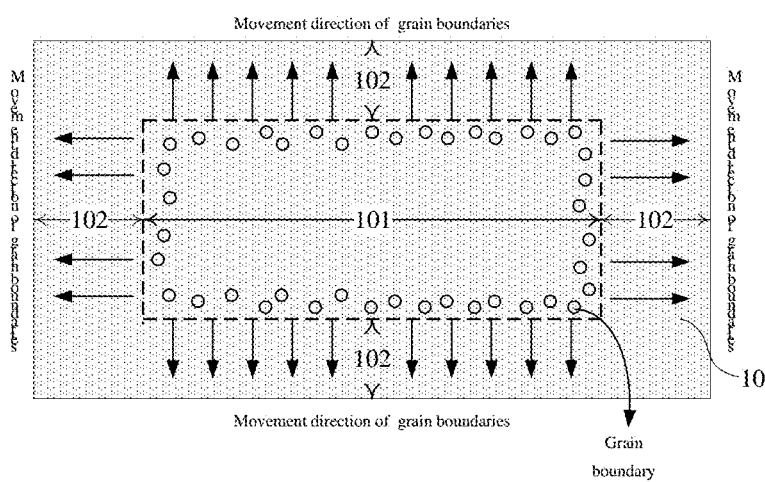

For example, as shown in FIG. 7*a* or FIG. 7*b*, due to the induction effect of the island region, the a-Si layer 30 has step-like temperature difference in different regions in the laser radiation crystallization process, i.e., the region of the a-Si layer 30, which corresponds to the first region 101, is cooled more rapidly, and other regions are cooled more slowly. It can be known from the above description that the grain boundaries of the p-Si are solidified last in the crystallization process, and thus, the movement directions of the grain boundaries are shown with reference to FIG. 7*a*, i.e., the grain boundaries are diffused and move from the first region 101 to the second region 102 on both sides; or, the movement directions of the grain boundaries are shown with reference to FIG. 7*b*, i.e., the grain boundaries are diffused and move from the first region 101 to the second region 102 around, so that in the finally formed LTPS active layer 01, the grain boundaries can be more centralized at the edges of the active layer and be far away from the center of the active layer. The center region of the active layer generally corresponds to the channel region when the TFT is turned on, so that the grain boundaries are more centralized at the edges of the channel and outside the channel while few grain boundaries are formed in the channel.

Meanwhile, because few grain boundaries are present in the channel, the following condition can be avoided that, after the a-Si is molten in the crystallization process, the extra volumes are accumulated at the grain boundaries to form the protrusions so as to cause the surface roughness of the grains to increase. Due to reduction of crystallization nonuniformity caused by factors such as a great amount of grain boundaries, high roughness of the grains or the like, the tunneling and inter-band tunneling phenomena generated when the TFT is turned on and promoted by the defects are correspondingly reduced, the leakage current of the TFT is reduced, and the stability of electrical performance of the TFT is improved.

Figure 8A:
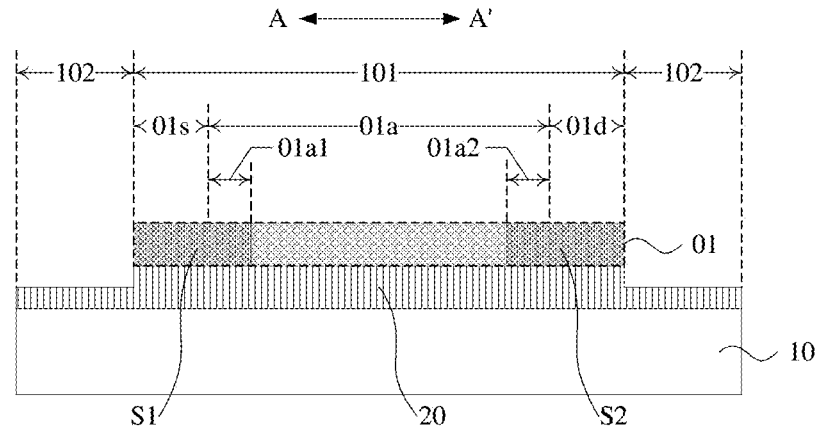
FIG. 8a to FIG. 8b respectively are a first and second sectional structural schematic diagrams of a Low Temperature Poly Silicon (LTPS) active layer obtained by adopting a preparation method of a TFT, which is provided by an embodiment of the present disclosure.
Figure 8B:
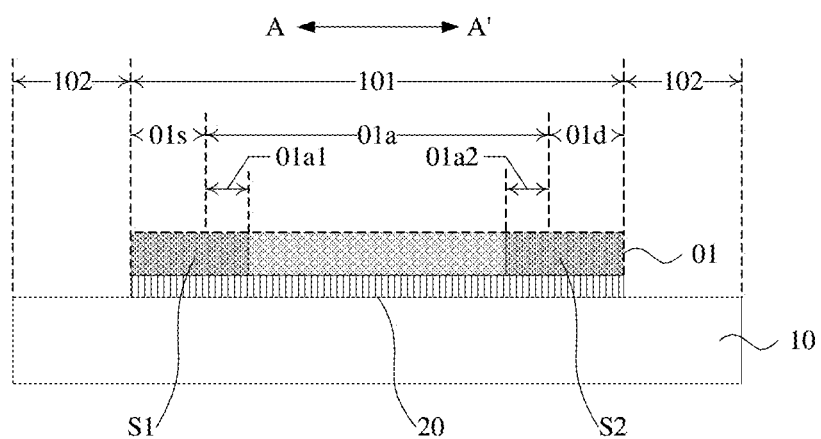

As shown in FIG. 8*a* or FIG. 8*b*, the formed LTPS active layer 01 is provided with a predetermined region 01*a*, a source electrode contact region 01*s*, and a drain electrode contact region 01*d*; the predetermined region 01*a* corresponds to a region opposite to a source electrode and a drain electrode which are to be formed.

The source electrode contact region 01*s* and the drain electrode contact region 01*d* are respectively positioned on both opposite sides of the first region 101, which sides are close to the second region 102.

Namely, with reference to FIG. 3*a*, for the case that the second region 102 is positioned on both opposite sides of the LTPS active layer 01 to be formed, the source electrode contact region 01*s* is positioned on one side of the predetermined region 01*a*, which is close to the second region 102, and the drain electrode contact region 01*d* is positioned on the other opposite side of the predetermined region 01*a*, which is close to the second region 102.

Or, with reference to FIG. 3*b*, for the case that the second region 102 is positioned around the LTPS active layer 01 to be formed, the source electrode contact region 01*s* and the drain electrode contact region 01*d* are respectively positioned on both opposite sides of the predetermined region 01*a*.

After the step S04 is completed, the preparation method further includes:

S05: with reference to FIG. 8a or FIG. 8b, carrying out ion doping in the source electrode contact region 01s and a first portion region 01a1 of the predetermined region 01a, which is close to the source electrode contact region 01s, so as to form a first doped region Si; and carrying out ion doping in the drain electrode contact region 01d and a second portion region 01a2 of the predetermined region 01a, which is close to the drain electrode contact region 01d, so as to form a second doped region S2.

Figure 9:
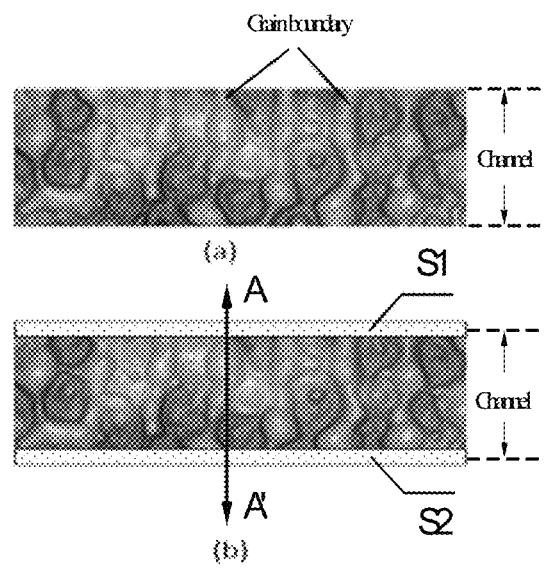
FIG. 9 is a comparison diagram of Atomic Force Microscope (AFM) microcosmic testing before and after the formed LTPS active layer is subjected to the step S05.

It should be noted that, first, in order to clearly show the effects of the first doped region 51 and the second doped region S2 in the formed LTPS active layer 01, FIG. 9 is further introduced herein. The portion (a) in FIG. 9 is a microtopography diagram obtained by taking the picture of the formed LTPS active layer 01 by means of an Atomic Force Microscope (AFM) before the step S05 is carried out; and dotted regions of the portion (b) in FIG. 9 show the formed first doped region 51 and second doped region S2, and it can be understood that the first doped region 51 and the second doped region S2 which are formed by ion doping are used as slightly doped regions, which is equivalent to form two opposite conductive bands or conductive wires in the formed TFT in the direction perpendicular to the movement direction of a channel current, so as to connect the grain boundaries, thereby reducing influence of the grain boundaries on carriers when the TFT is turned on, i.e., further reducing the leakage current when the TFT is turned on.

Figure 10:
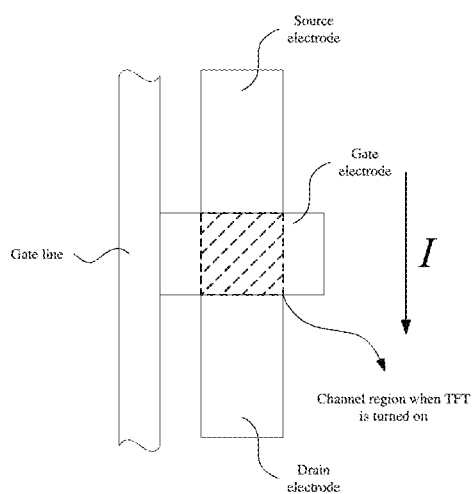

Herein, a channel current (I) when the TFT is turned on can be as shown in FIG. 10, i.e., point to the drain electrode from the source electrode of the TFT.

Secondly, with reference to FIG. 3a, for the former case, the second region 102 is positioned on both opposite sides of the LTPS active layer 01 to be formed, i.e., the grain boundaries in the formed a-Si can move towards both the opposite sides in a relatively collective manner, and thus, in order to make the first doped region 51 and the second doped region S2 which are formed by the ion doping have an effect of grain boundary connecting lines, the source electrode contact region 01s is positioned on one side of the predetermined region 01a, which is close to the second region 102, and the drain electrode contact region 01d is positioned on the other opposite side of the predetermined region 01a, which is close to the second region 102.

With reference to FIG. 3b, for the latter case, the second region 102 is positioned around the LTPS active layer 01 to be formed, i.e., the grain boundaries in the formed a-Si can move to the surrounding in a relatively collective manner, and thus, as long as the source electrode contact region 01s and the drain electrode contact region 01d are respectively positioned on both opposite sides of the predetermined region 01a, the step S05 of carrying out ion doping in the source electrode contact region 01s and the first portion region 01a1 of the predetermined region 01a, which is close to the source electrode contact region 01s, to form the first doped region S1 and similarly, carrying out ion doping in the drain electrode contact region 01d and the second portion region 01a2 of the predetermined region 01a, which is close to the drain electrode contact region 01d, to form the second doped region S2 can be implemented so as to take the effect of the grain boundary connecting lines.

Thirdly, in the step S05, exemplarily, doping ions can be boron ions, concentration of ion doping can be $1\times10^{15}$ ions per square centimeter, but the embodiment of the present disclosure is not limited hereto. For example, corresponding types and dosages of the doping ions can be flexibly selected according to different threshold voltages of the TFT to be formed.

For example, with reference to FIG. 8a or FIG. 8b, a width of the first doped region S1 along a turning-on direction is 1 to 2 μm; and/or, a width of the second doped region S2 along the turning-on direction is 1 to 2 μm. The turning-on direction is a direction pointing to the drain electrode contact region 01d from the source electrode contact region 01s.

Herein, if the widths of the first doped region S1 and the second doped region S2 are overly large, decrease of an effective width of the channel when the TFT is turned on can be invoked and the on-off characteristics of the TFT can be influenced; and if the widths of the first doped region S1 and the second doped region S2 are overly small, the aim of further reducing the leakage current by using the first doped region S1 and the second doped region S2 as the grain boundary connecting lines is difficult to fulfill.

On such basis, the width range can minimize the degree of influence of the formed LTPS active layer 01 on the channel when the TFT is turned on, and meanwhile, also can sufficiently fulfill the aim of further reducing the leakage current by using the first doped region Si and the second doped region S2 as the grain boundary connecting lines.

The step of forming the LTPS active layer 01 on the substrate 10 can include the following operations:

Forming the buffer layer 20 on the first region 101 and the second region 102 of the substrate 10 by a first patterning process, the buffer layer 20 having a thickness at the portion corresponding to the first region 101 greater than that at a portion corresponding to the second region 102; or, forming the buffer layer 20 on the first region 101 of the substrate 10 by a first masking process.

Removing the p-Si layer 30 on the second region 102 by a second patterning process, and forming the LTPS active layer 01 on the first region 101.

Shielding the region in the predetermined region 01a except the first portion region 01a1 and the second portion region 01a2 by a masking process; carrying out ion doping in the source electrode contact region 01s and the first portion region 01a1 of the predetermined region 01a, which is close to the source electrode contact region 01s, so as to form the first doped region S1; and carrying out ion doping in the drain electrode contact region 01d and the second portion region 01a2 of the predetermined region 01a, which is close to the drain electrode contact region 01d, so as to form the second doped region S2.

The masking process and the first patterning process adopt a same mask; and/or, the masking process and the second patterning process adopt a same mask.

It should be noted that, first, the buffer layer with different thicknesses needs to be formed on the substrate 10, or the buffer layer is only formed on a specific region of the substrate 10, and thus, the first patterning process means a process which applies a mask once to expose photoresist, develop, etch and remove the photoresist.

Figure 11:
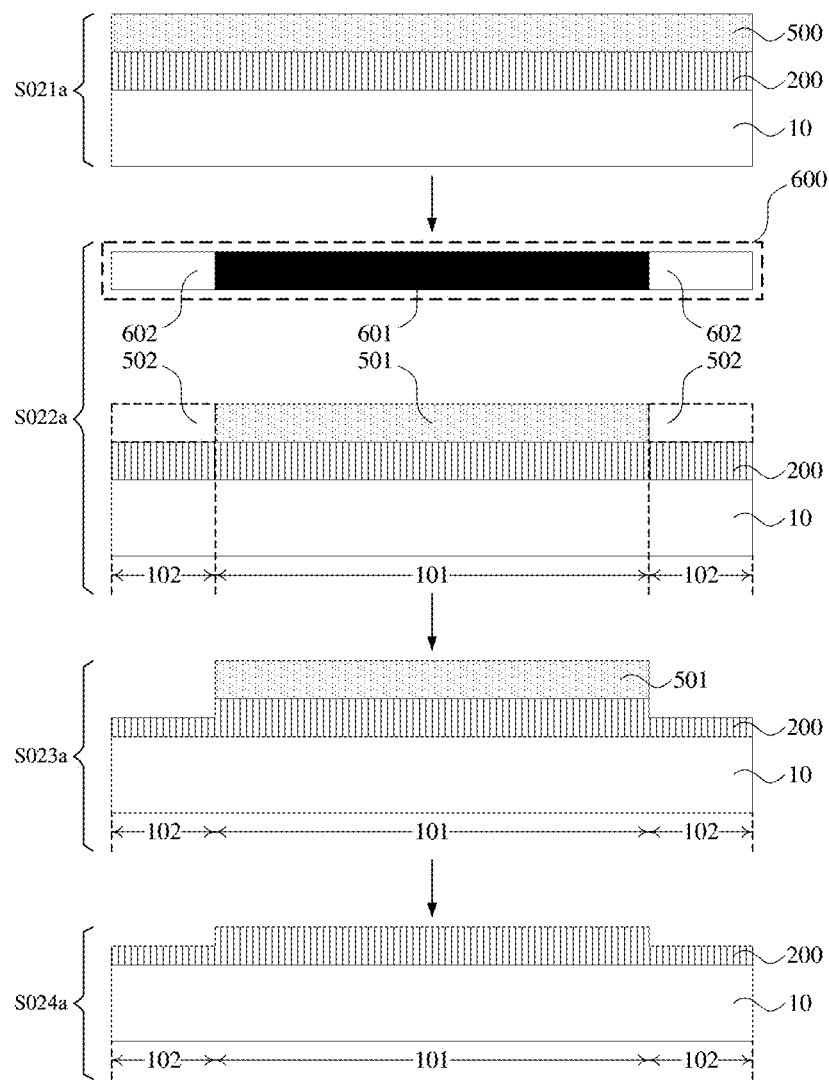
FIG. 11 is a distribution flow schematic diagram of the step S01.

As to the case of forming the buffer layer 20 on the first region 101 and the second region 102 of the substrate 10 by the first patterning process, the buffer layer 20 having the thickness at the portion corresponding to the first region 101 greater than that at the portion corresponding to the second region 102, as shown in FIG. 11, it can include sub-steps as follows:

S021a: sequentially forming a buffer layer thin film 200 and the photoresist 500 on the substrate 10.

S022a: carrying out exposure and development with the mask 600 on the substrate 10 on which the photoresist 500 is formed so as to form a photoresist fully-reserved region 501 and a photoresist fully-removed region 502 (which are shown with dashed boxes in drawings). The photoresist fully-reserved region 501 corresponds to the first region 101; and the photoresist fully-removed region 502 corresponds to the second region 102.

Herein, in the step S021a, for example, positive photoresist with higher exposure accuracy is adopted, i.e., the photoresist is not dissolved in developing solution before exposure and is converted into a substance capable of being dissolved in the developing solution after being exposed by ultraviolet rays.

For example, the photoresist fully-reserved region 501 and the photoresist fully-removed region 502 respectively correspond to a fully-non-transmittance region 601 and a fully-transmittance region 602 of the mask 600. An exposure principle of the mask 600 can refer to the prior art and is not repeated herein.

S023a: rendering a thickness of a portion of the buffer layer thin film 200, which is exposed out of the photoresist fully-removed region 502, to be smaller than that of a portion of the buffer layer thin film 200, which is covered by the photoresist fully-reserved region 501, by a thinning process (e.g., wet etching, dry etching, laser ablation or the like).

Herein, the effect of making the buffer layer thin film 200 have different thicknesses corresponding to different regions can be achieved by controlling parameters of etching or laser ablation, e.g., reaction time, reaction intensity or the like.

S024a: removing the photoresist reserved region 501 covered on the buffer layer thin film 200 corresponding to the first region 101, by an aching process.

The case of only forming the buffer layer 20 on the first region 101 of the substrate 10 by the first patterning process further includes sub-steps as follows:

S021b: sequentially forming the buffer layer thin film and the photoresist on the substrate 10;

S022b: carrying out exposure and development with the mask on the substrate 10 on which the photoresist is formed so as to form the photoresist fully-reserved region and the photoresist fully-removed region. The photoresist fully-reserved region corresponds to the first region 101 and the photoresist fully-removed region corresponds to the second region 102;

S023b: removing the buffer layer thin film exposed out of the photoresist fully-removed region, by the etching process;

S024b: removing the photoresist fully-removed region covered on the buffer layer thin film correspondingly to the second region 102, by the ashing process.

Herein, the patterning process of the steps S021b to S024b can refer to FIG. 11 and is not repeated herein.

Secondly, the LTPS active layer 01 has the corresponding pattern, and thus, the second patterning process means a process which applies the mask once to expose photoresist, develop, etch and remove the photoresist so as to obtain the patterned LTPS active layer 01.

Thirdly, the process of carrying out ion doping in the formed LTPS active layer 01 only relates to part of regions, and thus, the masking process is that the photoresist with a certain pattern is obtained by the mask and the region in the predetermined region 01a except the first portion region 01a1 and the second portion region 01a2 are shielded, so that the regions of the LTPS active layer 01, which are not covered by the photoresist, can be subjected to the doping process, e.g., ion injection, to form the first doped region 51 and the second doped region S2.

It can be known from the description above that the first patterning process, the second patterning process and the masking process all relate to use of masks, and thus, for example, the masking process and the first patterning process can adopt a same mask; and/or, the masking process and the second patterning process can adopt a same mask. Due to high cost of a mask, the preparation method provided by the embodiment of the present disclosure can form the first doped region 51 and the second doped region S2, on the basis of not increasing mask types, to fulfill the aims of connecting the grain boundaries, reducing influence of the grain boundaries on the carriers when the TFT is turned on and further reducing the leakage current when the TFT is turned on.

Based on the above-described, the step of removing the p-Si layer 30 on the second region 102 by the second patterning process and forming the LIPS active layer 01 on the first region 101 can include sub-steps as follows:

S041: forming the photoresist 500 on the formed p-Si layer 30.

S042: carrying out exposure and development with the mask 600 on the substrate 10 on which the photoresist 500 is formed so as to form the photoresist fully-reserved region 501 and the photoresist fully-removed region 502. The photoresist fully-reserved region 501 corresponds to the first region 101, and the photoresist fully-removed region 502 corresponds to the second region 102.

S043: removing the p-Si layer exposed out of the photoresist fully-removed region 502 so as to form the pattern of the LTPS active layer 01, by an etching process.

Herein, the patterning process of the steps S041 to S043 can refer to FIG. 11 and is not repeated herein.

Figure 12A:
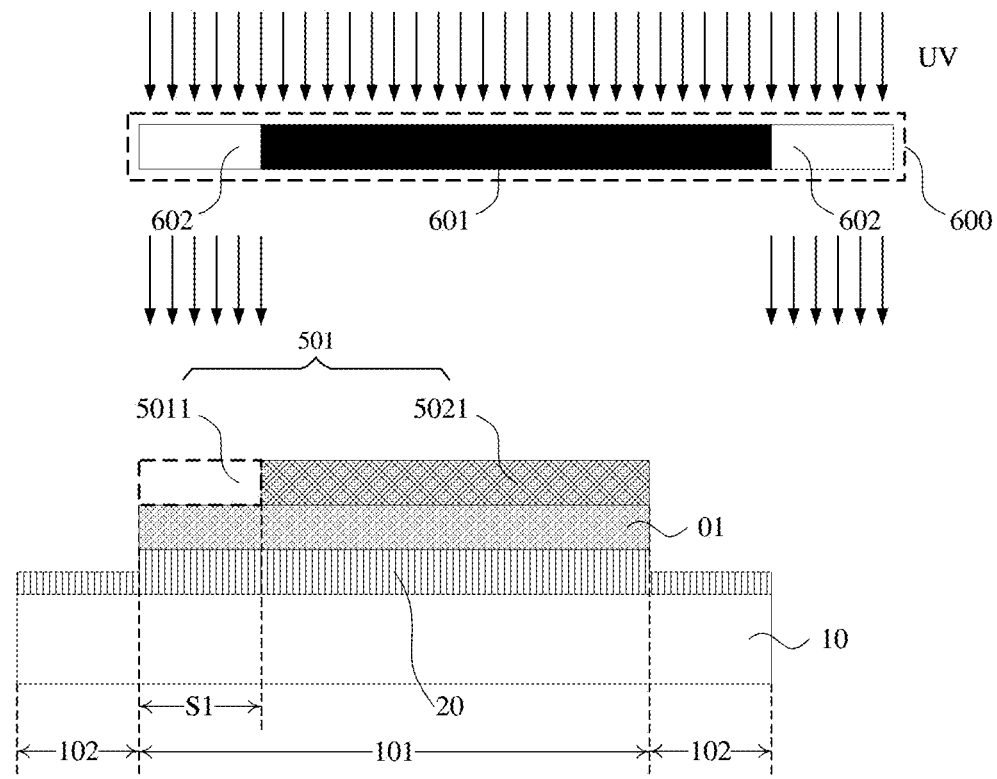
FIG. 12a to FIG. 12c sequentially are distribution flow schematic diagrams of the step S05.

Based on the above-described, the step of shielding the region in the predetermined region 01a except the first portion region 01a1 and the second portion region 01a2 by the masking process can include sub-steps as follows:

S051: as shown in FIG. 12a, carrying out for the first time the exposure (e.g., ultraviolet exposure, indicated with UV) and development processes with the mask 600 on the substrate 10 on which the photoresist fully-reserved region 501 is formed so as to form a first photoresist fully-reserved region 5021 and a first photoresist fully-removed region 5011.

The mask 600 includes the fully-non-transmittance region 601 and the fully-transmittance region 602 (which are shown with dashed boxes in drawings); the fully-transmittance region 602 corresponds to the first photoresist fully-removed region 5011, and the first photoresist fully-removed region 5011 corresponds to the first doped region 51 to be formed or the second doped region S2 to be formed (only S1 is taken as an example for illustration in the drawings); and the fully-non-transmittance region 601 corresponds to the formed first photoresist fully-reserved region 5021, and the first photoresist fully-reserved region 5021 corresponds to the remaining region of the photoresist fully-reserved region 501.

Herein, in the step S043, after the p-Si layer exposed out of the photoresist fully-removed region 502 is removed by the etching process, the photoresist fully-reserved region 501 still exists on the pattern of the formed LTPS active layer 01, and thus, the step S051 can be implemented after the step S043 is carried out, so that repeated deposition of the photoresist after the step S043 can be avoided.

Figure 12B:
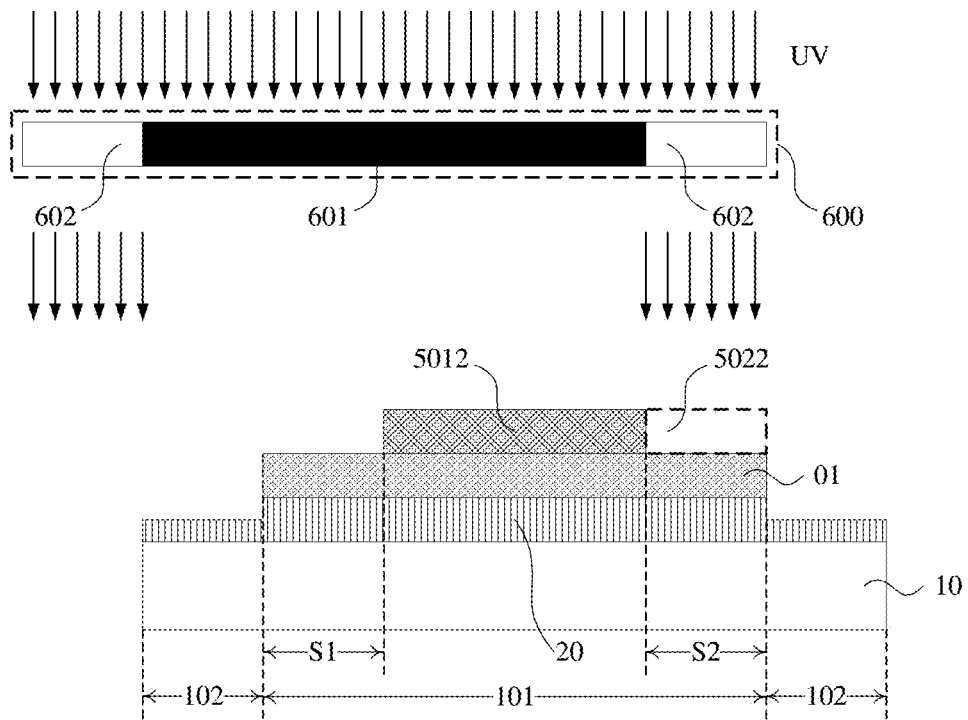

S052: as shown in FIG. 12b, carrying out for the second time the exposure and development processes with the mask 600 on the substrate 10 on which the first photoresist fully-reserved region 5021 (which is not shown in the drawing and can refer to FIG. 12a) is formed so as to form a second photoresist fully-reserved region 5012 and a second photoresist fully-removed region 5022.

The fully-transmittance region 502 corresponds to the second photoresist fully-removed region 5022, and the second photoresist fully-removed region 5022 corresponds to the second doped region S2 to be formed or the first doped region Si to be formed (the step S051 takes Si as the example for illustration, and thus, the step S052 takes S2 as an example for illustration); and the fully-non-transmittance region 601 corresponds to the formed second photoresist fully-reserved region 5012, and the second photoresist fully-reserved region 5012 corresponds to the remaining region of the first photoresist fully-reserved region 5021.

It should be noted that, first, if in the step S051, the formed first photoresist fully-removed region 5011 corresponds to the first doped region Si to be formed, then in the subsequent step S052, the formed second photoresist fully-removed region 5022 corresponds to the second doped region S2 to be formed, and vice versa, which will not be repeated herein.

Secondly, it can be known from the description above that the buffer layer 20 with the specific pattern, which is obtained by the first patterning process, corresponds to the LTPS active layer 01 with the specific pattern, which is obtained by the second patterning process, in pattern, and thus, the two patterning processes adopt the same mask 600 with the same fully-non-transmittance region 601 and fully-transmittance region 602.

Therefore, with reference to FIG. 12a, in the step S051 of forming the first photoresist fully-removed region 5011 exposed out of the first doped region S1 or the second doped region S2 with the same mask 600 as the step of the above-mentioned patterning process, the mask 600 can be shifted by a certain distance along the right-hand direction in the drawing, so that the fully-transmittance region 602 corresponds to the portion of the first photoresist fully-removed region 5011 which needs to be exposed out.

Similarly, with reference to FIG. 12b, in the step S052 of forming the second photoresist fully-reserved region 5012 exposed out of the second doped region S2 or the first doped region S1 by the same mask 600 as the step of the above-mentioned patterning process, the mask 600 can be shifted by a certain distance along the left-hand direction in the drawing, so that so that the fully-transmittance region 602 corresponds to the second photoresist fully-removed region 5022 which needs to be exposed out.

In this way, by adopting the same mask 600, regulating alignment and exposure conditions, reducing a width in the exposure process and increasing a critical dimension bias (CD bias) in the exposure process, the second photoresist fully-reserved region 5012 with a smaller area than the LTPS active layer 01 can be obtained through two times of exposure and development in the steps S051 to S052 on the premise of not increasing the mask types, so that the regions uncovered by the second photoresist fully-reserved region 5012 are subjected to ion doping in an ion injection mode to form the first doped region S1 and the second doped region S2.

Figure 12C:
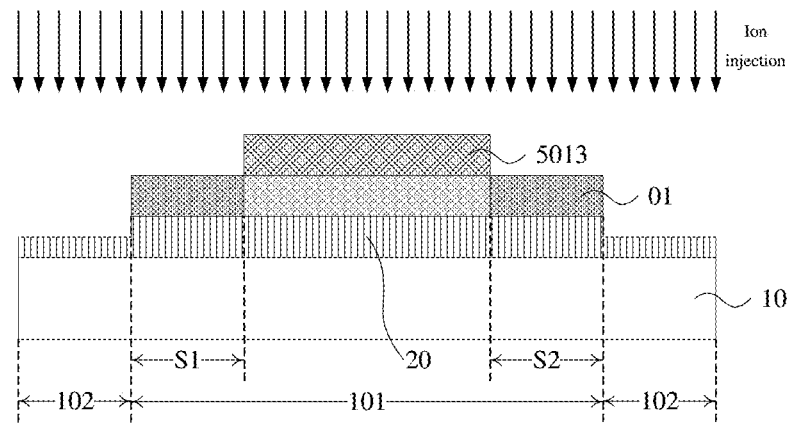

For example, after the steps S051 to S052 are completed, the step of carrying out ion doping in the source electrode contact region 01s and the first portion region 01a1 of the predetermined region 01a, which is close to the source electrode contact region 01s, so as to form a first doped region Si and carrying out ion doping in the drain electrode contact region 01d and the second portion region 01a2 of the predetermined region 01a, which is close to the drain electrode contact region 01d, so as to form the second doped region S2, can include sub-steps as follows:

S053: as shown in FIG. 12c, carrying out ion doping in the regions of the formed LTPS active layer 01, which are not covered by the second photoresist fully-reserved region 5012, through ion injection so as to form the first doped region S1 and the second doped region S2.

After the step S053, the preparation method can further include a step of removing a third photoresist fully-reserved region 5013 by an ashing process.

Here, in the process of carrying out ion injection in the step S053, the second photoresist fully-reserved region 5012 which is not removed can shield regions in the LTPS active layer 01, which do not need to be subjected to ion injection.

On the basis of the above-described, before the step S03, the preparation method further includes the following operations:

Carrying out a dehydrogenation process on the formed a-Si layer 30.

This step aims to avoid hydrogen explosion (i.e., commonly referred to as flash explosion) generated due to residual hydrogen inside the a-Si layer 30 when the a-Si layer 30 is crystallized by laser radiation. The temperature of the dehydrogenation process exemplarily can be 350 to 450° C., and such temperature range can make hydrogen sufficiently escape from the a-Si thin film 30 (for example, the content of residual hydrogen in the a-Si layer 30 is controlled in a range of 2%), and meanwhile, also can avoid influence on performance of the a-Si layer 30 due to the excessively high temperature of dehydrogenation process.

Figure 13:
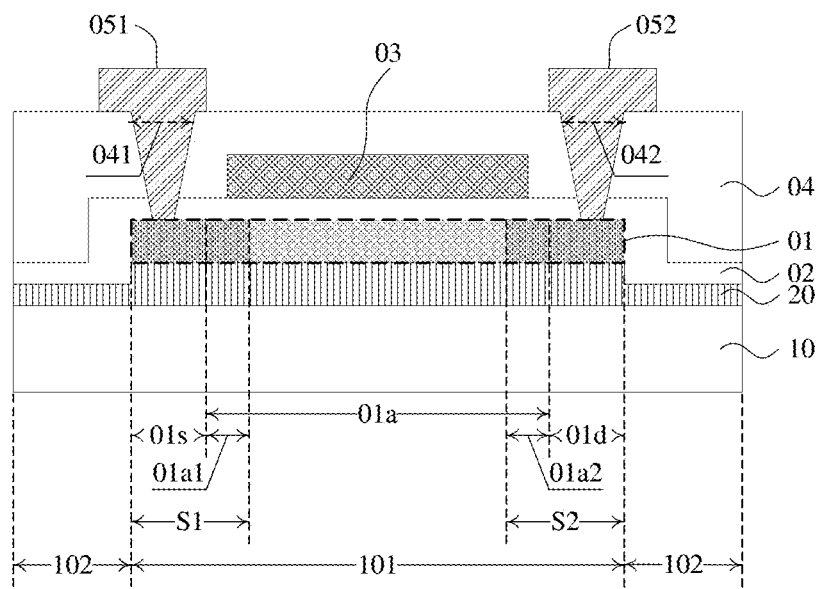
FIG. 13 is a sectional structural schematic diagram of a TFT obtained by the step S06.

On the basis of the above-described, after the step S05, the preparation method further includes:

S06: as shown in FIG. 13, on the formed LTPS active layer 01, sequentially forming a gate insulating layer 02, a pattern layer including a gate electrode 03, an interlayer insulating layer 04, and a pattern layer including the source electrode 051 and the drain electrode 052. The source electrode 051 and the drain electrode 052 are in contact with the LTPS active layer 01 respectively through a first via hole 041 and a second via hole 042 which run through the interlayer insulating layer 04 and the gate insulating layer 02.

In this way, the type of the TFT formed by the steps S01 to S06 is a top gate type (i.e., the gate electrode is positioned on the other side of the active layer, which side is farther away from the substrate).

Compared with the TFT in the structure of a bottom gate type (i.e., the gate electrode is positioned on one side of the active layer, which side is closer to the substrate), the source electrode 051 and the drain electrode 052 in the TFT structure are not directly deposited on the LTPS active layer 01 so as to avoid damage to performance of the LTPS active layer 01 by the high temperature generated in the film forming process of the source electrode 051 and the drain electrode 052.

Here, all steps of forming the gate insulating layer 02, the pattern layer including the gate electrode 03, the interlayer insulating layer 04 and the pattern layer including the source electrode 51 and the drain electrode 052 can common processes and are not repeated herein.

An embodiment of the present disclosure further provides a TFT obtained by adopting the preparation method. The TFT includes an LTPS active layer 01. Grain boundaries in the LTPS active layer 01 are at least partially centralized at the edge of the LTPS active layer.

In the TFT, the grain boundaries formed in the LTPS active layer 01 can be relatively centralized at the edge of the active layer and be far away from the center of the active layer, and the center region of the active layer generally corresponds to a channel region when the TFT is turned on, and thus, the grain boundaries are more centralized at the edge of the channel and outside the channel while few grain boundaries are formed in the channel.

Meanwhile, due to few grain boundaries in the channel, crystallization nonuniformity caused by factors such as a great amount of grain boundaries, high roughness of grains, or the like can be reduced, and thus, tunneling and inter-band tunneling phenomena generated when the TFT is turned on and assisted by defects are correspondingly reduced, so that a leakage current of the TFT is reduced, and the stability of electrical performance of the TFT is improved.

With reference to FIG. 8a or FIG. 8b, in the TFT, the LTPS active layer 01 has a predetermined region 01a, and a source electrode contact region 01s and a drain electrode contact region 01d which are respectively positioned on two opposite sides of the predetermined region 01a. The predetermined region 01a corresponds to a region opposite to a source electrode and a drain electrode which are to be formed; for example, the LTPS active layer 01 includes ion doped regions and a non-doped region which are configured to connect the grain boundaries. The ion doped regions include a first doped region S1 and a second doped region S2. The first doped region S1 corresponds to the source electrode contact region 01s and a first portion region 01a1 of the predetermined region 01a, which is close to the source electrode contact region 01s; and the second doped region S2 corresponds to the drain electrode contact region 01d and a second portion region 01a2 of the predetermined region 01a, which is close to the drain electrode contact region 01d.

Here, the first doped region S1 and the second doped region S2 are formed as slightly doped regions, which is equivalent to form two opposite conductive bands or conductive wires in the formed TFT in the direction perpendicular to the movement direction of a channel current so as to connect the grain boundaries, thereby reducing influence of the grain boundaries on the carriers when the TFT is turned on and further reducing the leakage current when the TFT is turned on.

The channel current (I) when the TFT is turned on can refer to FIG. 10, i.e., points to the drain electrode from the source electrode of the TFT.

For example, with reference to FIG. 8a or FIG. 8b, the width of the first doped region Si along a turning-on direction is 1 to 2 μm; and/or, the width of the second doped region S2 along the turning-on direction is 1 to 2 μm. The turning-on direction is a direction pointing to the drain electrode contact region 01d from the source electrode contact region 01s.

Here, if the widths of the first doped region S1 and the second doped region S2 are overly large, decrease in the effective width of the channel when the TFT is turned on can be caused, and the on-off characteristics of the TFT can be influenced. If the widths of the first doped region Si and the second doped region S2 are overly small, the aim of further reducing the leakage current by using the first doped region Si and the second doped region S2 as the grain boundary connecting lines is difficult to fulfill.

For example, with reference to FIG. 13, the TFT further includes: a gate insulating layer 02 covering the LTPS active layer 01; a pattern layer positioned on the gate insulating layer 02 and including a gate electrode 03; an interlayer insulating layer 04 covering the pattern layer including the gate electrode 03; and a pattern layer positioned on the interlayer insulating layer 04 and including the source electrode 51 and the drain electrode 52. The source electrode 051 and the drain electrode 052 are in contact with the LTPS active layer 01 respectively through a first via hole 041 and a second via hole 042 which run through the interlayer insulating layer 04 and the gate insulating layer 03.

The type of the TFT is a top gate type; compared with a TFT with a structure of a bottom gate type, the source electrode 051 and the drain electrode 052 in this TFT structure are positioned above the LTPS active layer 01 and are separated by the gate insulating layer 03 and the interlayer insulating layer 04, so that damage to performance of the LTPS active layer 01 by the high temperature generated in the film forming process of the source electrode 051 and the drain electrode 052.

Here, materials of all the gate insulating layer 02, the pattern layer including the gate electrode 03, the interlayer insulating layer 04 and the pattern layer including the source electrode 051 and the drain electrode 052 can use processes of common technologies and are not repeated herein.

Based on the above described, an embodiment of the present disclosure further provides a preparation method of an array substrate. The preparation method includes a step of forming a TFT on a substrate 10, wherein the TFT is obtained by means of adopting the above-mentioned preparation method.

Correspondingly, an embodiment of the present disclosure further provides an array substrate. The array substrate includes a plurality of TFTs arranged in an array mode, and the TFTs include the above-mentioned TFT(s).

An embodiment of the present disclosure further provides a display apparatus. The display apparatus includes the above-mentioned array substrate.

The display apparatus can be any product or part with a display function, e.g., a liquid crystal panel, a liquid crystal display, a liquid crystal television, an Organic Light-Emitting Display (OLED) panel, an OLED display, an OLED television, a mobile phone, a tablet computer, electronic paper, a digital photo frame or the like.

According to the TFT and the preparation method thereof, the array substrate and the display apparatus which are provided by the embodiments of the present disclosure, due to the induction effect of the island region, the a-Si layer has step-like temperature difference in different regions during the laser radiation crystallization process, the movement direction of the grain boundaries is diffused and moves from the first region 101 to the second region 102 on both sides or around, so in the formed LTPS active layer, the grain boundaries are centralized at the edge of the active layer and be far away from the center of the active layer, the grain boundaries can be more centralized at the edge of the channel and outside the channel, and few grain boundaries are formed in the channel.

Due to few grain boundaries in the channel, the condition that after the a-Si is molten in the crystallization process, the residual volumes are accumulated at the grain boundaries to form the protrusions so as to cause increase of the surface roughness of the grains is avoided. Due to reduction of crystallization nonuniformity caused by factors such as a great amount of grain boundaries, high roughness of the grains or the like, the tunneling and inter-band tunneling phenomena generated when the TFT is turned on and promoted by the defects are correspondingly reduced, the leakage current of the TFT is reduced, and the stability of electrical performance of the TFT is improved.

It should be noted that all the accompanying drawings of the present disclosure are brief schematic diagrams of the TFT and the preparation method thereof, and in order to clearly describe the related structures of the embodiments of the present disclosure, some common or similar structures are omitted, however, it does not mean that the embodiments of the present disclosure are limited to the structures shown in the drawings, and it should be understood that the embodiments of the present disclosure include other corresponding structures.

The above-described involves merely specific embodiments of the present disclosure, and not intended to define the scope of the present disclosure. Any variations or replacements which can be easily thought of by those skilled in the art in the scope of the present disclosure all shall fall within the scope of protection of the present disclosure.

The present application claims priority of the Chinese Patent Application No. 201510330790.4, filed on Jun. 15, 2015, entitled "THIN FILM TRANSISTOR AND PREPARATION METHOD THEREOF, ARRAY SUBSTRATE AND DISPLAY APPARATUS", the entire contents of which are incorporated herein by reference.

What is claimed is:

1. A preparation method of a thin film transistor, comprising: an operation of forming a low temperature poly silicon active layer on a substrate, wherein the substrate comprising a first region and a second region; the first region corresponds to a pattern of the low temperature poly silicon active layer to be formed, and the second region is at least positioned on both opposite sides of the low temperature poly silicon active layer to be formed, the low temperature poly silicon active layer comprises a predetermined region, a source electrode contact region and a drain electrode contact region, and the predetermined region corresponds to a region opposite to a source electrode and a drain electrode which are to be formed, and the source electrode contact region and the drain electrode contact region are respectively positioned on two opposite sides in the first region, which are close to the second region, and the operation of forming the low temperature poly silicon active layer on the substrate includes:
  forming a buffer layer on the first region and the second region of the substrate by a first patterning process, the buffer layer having a thickness at a portion corresponding to the first region greater than that at a portion corresponding to the second region;
  forming an amorphous silicon layer on the buffer layer;
  performing laser crystallization processing on the amorphous silicon layer so as to convert the amorphous silicon layer into a poly silicon layer;
  removing the poly silicon layer on the second region by a second patterning process, and forming the low temperature poly silicon active layer on the first region; and
  shielding a region in the predetermined region except a first portion region and a second portion region by a masking process; carrying out ion doping in the source electrode contact region and the first portion region of the predetermined region, which is close to the source electrode contact region, so as to form a first doped region; and carrying out ion doping in the drain electrode contact region and the second portion region of the predetermined region, which is close to the drain electrode contact region, so as to form a second doped region;

wherein the masking process and the first patterning process adopt a same mask; and/or, the masking process and the second patterning process adopt a same mask;

wherein the operation of removing the poly silicon layer on the second region by the second patterning process and forming the low temperature poly silicon active layer on the first region comprises: forming photoresist on the formed poly silicon layer; carrying out exposure and development with the mask on the substrate on which the photoresist is formed so as to form a photoresist fully-reserved region and a photoresist fully-removed region, wherein the photoresist fully-reserved region corresponds to the first region, and the photoresist fully-removed region corresponds to the second region; and removing the poly silicon layer exposed out of the photoresist fully-removed region by an etching process, so as to form a pattern of the low temperature poly silicon active layer; and wherein the operation of shielding the region in the predetermined region except the first portion region and the second portion region of the predetermined region by the masking process comprises: carrying out for a first-time exposure and development with the mask on the substrate on which the photoresist fully-reserved region is formed so as to form a first photoresist fully-reserved region and a first photoresist fully-removed region, wherein a fully-transmittance region of the mask corresponds to the first photoresist fully-removed region, and the first photoresist fully-removed region corresponds to the first doped region to be formed or the second doped region to be formed; and a fully-non-transmittance region of the mask corresponds to the formed first photoresist fully-reserved region, and the first photoresist fully-reserved region corresponds to a remaining region of the photoresist fully-reserved region; and carrying out for a second-time exposure and development with the mask on the substrate on which the first photoresist fully-reserved region is formed so as to form a second photoresist fully-reserved region and a second photoresist fully-removed region, wherein the fully-transmittance region of the mask corresponds to the second photoresist fully-removed region, and the second photoresist fully-removed region corresponds to the second doped region to be formed or the first doped region to be formed; and the fully-non-transmittance region of the mask corresponds to the formed second photoresist fully-reserved region, and the second photoresist fully-reserved region corresponds to a remaining region of the first photoresist fully-reserved region.

2. The preparation method according to claim 1, wherein the operation of forming the buffer layer on the first region and the second region of the substrate by the first patterning process, the buffer layer having the thickness at the portion corresponding to the first region greater than that at the portion corresponding to the second region, includes:
  sequentially forming a buffer layer thin film and photoresist on the substrate;
  carrying out exposure and development with the mask on the substrate on which the photoresist is formed so as to form the photoresist fully-reserved region and the photoresist fully-removed region, wherein the photoresist fully-reserved region corresponds to the first region and the photoresist fully-removed region corresponds to the second region;

rendering a thickness of a portion of the buffer layer thin film, which is exposed out of the photoresist fully-removed region, to be smaller than that of a portion of the buffer layer thin film, which is covered by the photoresist fully-reserved region, by a thinning process; and removing the photoresist fully-reserved region covered on the buffer layer thin film corresponding to the first region, by an ashing process.

3. The preparation method according to claim 1, wherein a width of the first doped region along a turning-on direction is from 1 μm to 2 μm; and/or, a width of the second doped region along the turning-on direction is from 1 μm to 2 μm, wherein the turning-on direction is a direction pointing to the drain electrode contact region from the source electrode contact region.

4. The preparation method according to claim 1, further comprising: before converting the amorphous silicon layer into the poly silicon layer, carrying out a dehydrogenation process on the formed amorphous silicon layer.

5. The preparation method according to claim 1, further comprising: after forming the low temperature poly silicon active layer on the first region, sequentially forming a gate insulating layer, a pattern layer including a gate electrode, an interlayer insulating layer, and a pattern layer including a source electrode and a drain electrode, on the formed low temperature poly silicon active layer, wherein the source electrode and the drain electrode are in contact with the low temperature poly silicon active layer respectively through a first via hole and a second via hole which run through the interlayer insulating layer and the gate insulating layer.

6. The preparation method according to claim 1, wherein the buffer layer is made of any one of materials: silicon oxide, silicon nitride or silicon oxynitride.

7. The preparation method according to claim 1, wherein the second region is positioned around the first region.

* * * * *